United States Patent [19]
Bothra et al.

[11] Patent Number: 6,013,927
[45] Date of Patent: Jan. 11, 2000

[54] SEMICONDUCTOR STRUCTURES FOR SUPPRESSING GATE OXIDE PLASMA CHARGING DAMAGE AND METHODS FOR MAKING THE SAME

[75] Inventors: Subhas Bothra, San Jose; Harlan Lee Sur, Jr., San Leandro, both of Calif.

[73] Assignee: VLSI Technology, Inc., San Jose, Calif.

[21] Appl. No.: 09/052,859

[22] Filed: Mar. 31, 1998

[51] Int. Cl.[7] .................................................. H01L 29/76
[52] U.S. Cl. ........................ 257/328; 257/356; 257/508; 257/607
[58] Field of Search ................................... 257/328, 356, 257/508, 607

[56] References Cited

U.S. PATENT DOCUMENTS

| | | | |
|---|---|---|---|
| 4,543,597 | 9/1985 | Shibata | 257/296 |
| 4,689,871 | 9/1987 | Malhi | 257/328 |
| 5,844,282 | 12/1998 | Noguchi | 257/356 |

OTHER PUBLICATIONS

K.P. Cheung, *"Plasma Charging Damage"*, IEEE 1997 Tutorial Notes, Int'l Reliability Physics Symposium, Apr. 7–10, 1997, pp. 4.1–4.44, Bell Labs/Lucent Technologies, Murray Hill, NJ.

*Primary Examiner*—Mark V. Prenty
*Attorney, Agent, or Firm*—Martine Penilla & Kim, LLP

[57] ABSTRACT

Disclosed is a semiconductor diode structure, and method for making semiconductor diode structures for suppressing transistor gate oxide plasma charging damage. The semiconductor diode structure includes a shallow trench isolation region that is configured to isolate an active region of a semiconductor substrate. A doped polysilicon electrode having a first end and a second end. The doped polysilicon electrode is defined in the shallow trench isolation region and the first end is configured to be in electrical contact with the semiconductor substrate. The diode structure further includes a polysilicon gate that has an underlying gate oxide. The polysilicon gate is defined over the active region and extends over part of the shallow trench isolation region so as to make electrical interconnection between the polysilicon gate and the second end of the doped polysilicon electrode.

17 Claims, 11 Drawing Sheets

SEMICONDUCTOR STRUCTURES FOR SUPPRESSING GATE OXIDE PLASMA CHARGING DAMAGE AND METHODS FOR MAKING THE SAME

BACKGROUND OF THE INVENTION

1. Field of the Invention

The present invention relates generally to semiconductor circuits and, more particularly, to semiconductor structures for protecting transistor gate oxides during plasma etch fabrication operations.

2. Description of the Related Art

As is well known in the art, semiconductor devices are fabricated over a semiconductor substrate that is subjected to numerous processing operations. By way of example, a semiconductor device is typically subjected to several plasma etching operations, which are designed to pattern the various substrate, oxide and metallization layers and construct the desired circuit layout. Although plasma etching has become the etching process of choice, the intense energies used to create the etching plasma has had a degrading effect on thin sensitive gate oxides that lie under gate electrodes of a given circuit design. Specifically, the plasma that is generated in etching chambers is designed to bombard a layer being etched with a high concentration of electrons and positively charged ions. Unfortunately, these electrons and positively charged ions are known to induce intense currents through the gate oxides, which necessarily produce oxide degrading traps in the gate oxides.

With this in mind, FIG. 1A shows a cross-sectional view of a semiconductor substrate 100 during a plasma etch 102 operation. In this example, the semiconductor substrate 100 is patterned with a photoresist mask 108, which enables patterning of a polysilicon gate 106 that lies over a gate oxide 104. As mentioned above, when the plasma etch operation is performed, a large amount of positively charged ions and negatively charged electrons are caused to come into contact with exposed surface areas of the polysilicon gate 106. When this happens, strong electrical currents are caused to flow between the polysilicon gate 106, through the gate oxide 104, and into the substrate 100.

Unfortunately, during normal plasma etch operations, these electrical currents can become quite substantial, and therefore may cause what are known as "traps" inside the gate oxide 104. These traps that are formed inside the chemical bonds of the gate oxide 104 therefore detrimentally degrade the gate oxide 104, which can lead to gate current leakage. For example, properly functioning transistor devices require gate oxides 104 that adequately isolate the polysilicon gate 106 from the substrate 100. However, when the gate oxide 104 accumulates a large amount of trap charging, the degraded gate oxide 104 may no longer insulate the polysilicon gate 106 from the semiconductor substrate 100 and leakage currents will occur through the gate oxide 104.

FIG. 1B shows a more detailed diagram of the polysilicon gate 106 that includes a silicided metallization layer 106a. The polysilicon gate 106 is now shown in contact with a degraded gate oxide 104'. On either side of the polysilicon gate 106 and the degraded gate oxide 104', are oxide spacers 109. The oxide spacers 109 sit partially over the diffusion regions 112. In a properly functioning transistor gate, the gate oxide is supposed to electrically isolate the polysilicon gate 106 from the substrate 100. However, when the degraded gate oxide 104' builds up a large amount of chemical bond altering traps due to the repeated electrical exposure to plasma etch operations, the degraded gate oxide 104' will no longer perform its isolation function.

As shown, a channel region 110 is formed between the diffusion regions 112 in the semiconductor substrate 100. In a properly functioning device, the transistor having the polysilicon gate 106 can control the channel region 110 to be in an ON state or OFF state depending on the voltage applied to the polysilicon gate 106. However, when the degraded gate oxide 104' no longer isolates the polysilicon gate 106 from the substrate 100, the polysilicon gate loses control over the channel region 110. As can be appreciated, when this happens, the semiconductor device will fail to operate in its designed manner. As a result, not only will a single transistor fail to operate for its intended purpose, but an entire semiconductor chip may fail to operate properly and perform its desired functional operations.

It should also be appreciated that the gate oxide 104 is susceptible to degradation during each stage that a plasma etching operation is performed, and electrical conduction between the plasma etching and the gate oxide 104 exists. By way of example, the oxide spacers 109 are generally formed by depositing an oxide layer over the entire surface of a wafer, and then subsequently performing a plasma etch until this oxide spacers 109 remain. However, when such oxide spacer etching is performed, the polysilicon gate 106 will come into electrical contact with the plasma etching that is used to perform the oxide spacer formation.

Thus, additional plasma induced currents "I" will unfortunately cause further trap formation in the degraded gate oxide 104'. Additionally, when subsequent via hole etching operations and metallization interconnect patterning operations are performed, that plasma etching will also come into electrical contact with the polysilicon gate 106, which will then conduct additional current through the degraded gate oxide 104', thereby producing additional traps in the degraded gate oxide 104'.

As shown in FIG. 1C, when a via hole is plasma etched in an intermetal dielectric 116, the plasma ions and electrons will also come into contact with the silicided metallization layer 106a that lies over the polysilicon gate 106. As a result, oxide destructive currents will also be caused to occur through the degraded gate oxide 104'. Additionally, when a patterned metallization line 118 is formed over and in contact with an electrical tungsten plug 117, the ions and electrons produced by the plasma patterning will again cause currents to flow through the degraded gate oxide 104'.

In prior art attempts to divert plasma induced currents away from the gate oxide 104, diode structures have been fabricated beside sensitive transistor gate structures. As shown in FIG. 1D, the diode structure includes an N+ well 150 which interfaces with a P-type substrate to form a solid state diode structure. The diode structure is a leaky diode structure which allows a current $I_D$ to flow away from the gate oxide 104 and down a via 117a during plasma etching.

Unfortunately, fabricating these diode structures beside sensitive transistor devices has the downside of requiring a substantial amount of additional chip space. This is because such diode designs are typically only fabricated to suppress large currents produced when transistor gates have large contact surfaces 106b as shown in FIG. 1E. These large contact surfaces 106b are known to cause "antenna effects," which also detrimentally produce very large oxide destructive currents "I".

Furthermore, the diode structure of FIG. 1D will not assist in protecting the gate oxide 104 until interconnect layers, such as the patterned metallization layer 118' is formed. That is, the diode structure will not protect the gate oxide 104' during the polysilicon gate 106 patterning, during the spacer 109 formation, and when a via hole is etched through the intermetal oxide 116 in order to form a conductive via 117. Accordingly, by the time a protection diode structure is formed beside a sensitive transistor device, the gate oxide 104 will already have been exposed to a substantial amount of destructive current induced by the plasma patterning operations.

In view of the foregoing, there is a need for compact protection device structures which assist in protecting gate oxides from the formation of traps and subsequent oxide degradation. There is also a need for protecting the gate oxides in order to prevent leakage currents and malfunctioning transistor structures.

SUMMARY OF THE INVENTION

Broadly speaking, the present invention fills these needs by providing compact gate oxide protection structures and methods for fabricating the gate oxide protection structures that suppress the formation of gate oxide degrading traps. It should be appreciated that the present invention can be implemented in numerous ways, including as a process, an apparatus, a system, a device, or a method. Several inventive embodiments of the present invention are described below.

In one embodiment, a semiconductor structure for suppressing gate oxide plasma charging damage is disclosed. The semiconductor structure includes a shallow trench isolation region that is configured to isolate an active region of a semiconductor substrate. A doped polysilicon electrode having a first end and a second end. The doped polysilicon electrode is defined in the shallow trench isolation region and the first end is configured to be in electrical contact with the semiconductor substrate. The structure further includes a polysilicon gate that has an underlying gate oxide. The polysilicon gate is defined over the active region and extends over part of the shallow trench isolation region so as to make electrical interconnection between the polysilicon gate and the second end of the doped polysilicon electrode.

In another embodiment, a method for making a plasma charging damage protection device for protecting transistor gate oxides is disclosed. The method includes forming a shallow trench in a semiconductor substrate and filling the shallow trench with an oxide material to form a shallow trench isolation region that electrically isolates an active region of the semiconductor substrate. The method further includes defining a via hole in the shallow trench isolation region so as to define a path down to the semiconductor substrate, and filling the via hole with a doped polysilicon material so as to form a doped polysilicon electrode that is in contact with the semiconductor substrate. The method also includes forming a transistor gate structure that extends over the active region and the shallow trench isolation region, so that the transistor gate structure is in electrical contact with at least part of the doped polysilicon electrode. Preferably, the interface between the doped polysilicon electrode and the semiconductor substrate forms a solid state diode that provides a diverting path for plasma induced currents, thereby protecting the gate oxide of the transistor gate structure from degradation.

In yet another embodiment, a diode structure for suppressing plasma charging damage to transistor gate oxides is disclosed. The diode structure is defined in a shallow trench isolation region that is configured to isolate an active region of a semiconductor substrate. In this embodiment, the diode structure includes a doped polysilicon electrode means that has a first end and a second end. The doped polysilicon electrode is defined in the shallow trench isolation region, and the first end is in electrical contact with the semiconductor substrate. The diode structure further includes a transistor gate means that has an underlying gate oxide that is defined over the active region and extends over part of the shallow trench isolation region. In this manner, the transistor gate means makes an electrical interconnection with the second end of the doped polysilicon electrode means.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for gate oxide protection structures and methods for fabricating the gate oxide protection structures is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
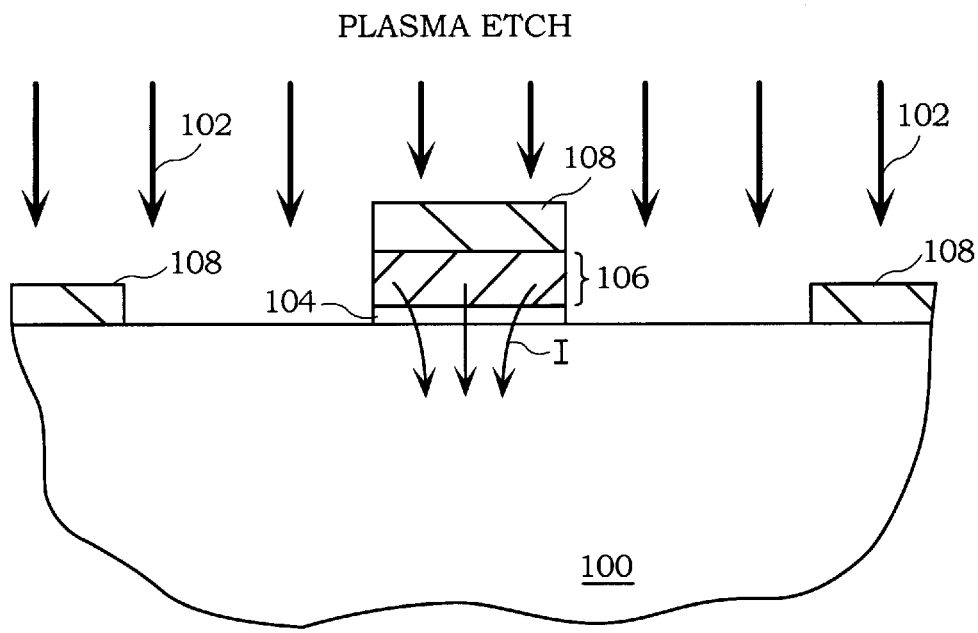
FIG. 1A shows a cross-sectional view of a semiconductor substrate during a plasma etch operation.
Figure 1B:
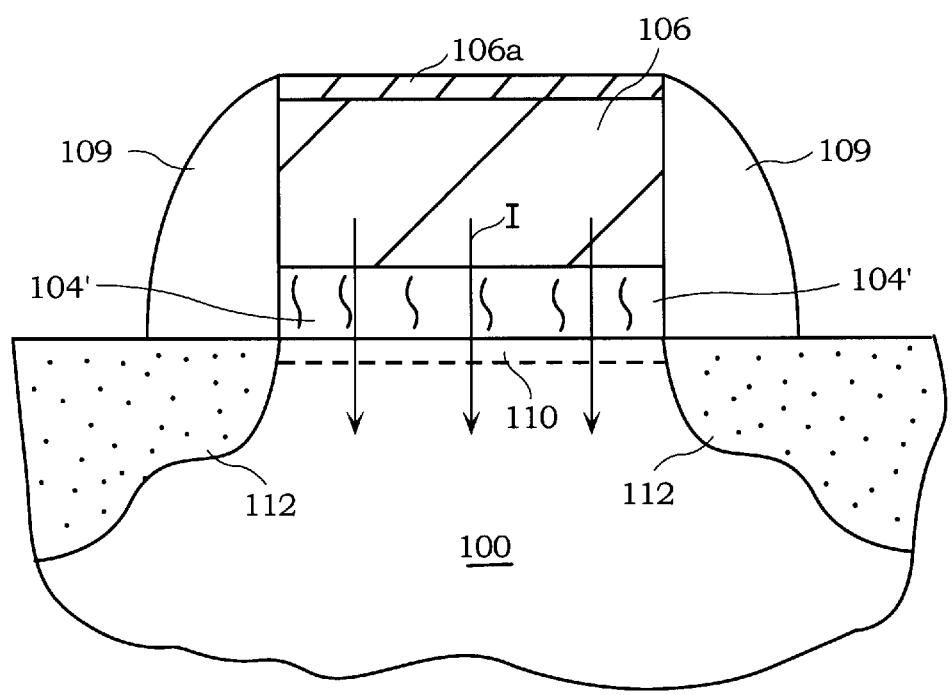
FIG. 1B shows a more detailed diagram of a polysilicon gate and gate oxide that is degraded due to plasma induced currents.
Figure 1C:
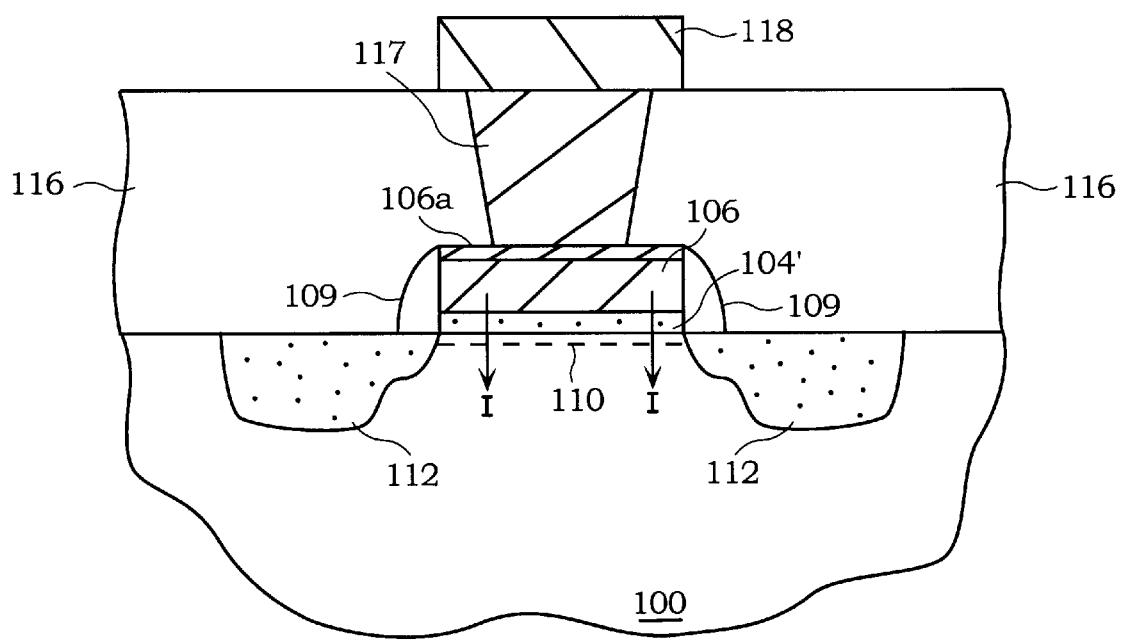
FIG. 1C shows the cross-sectional view of FIG. 1B after subsequent deposition and plasma etching operations are performed.
Figure 1D:
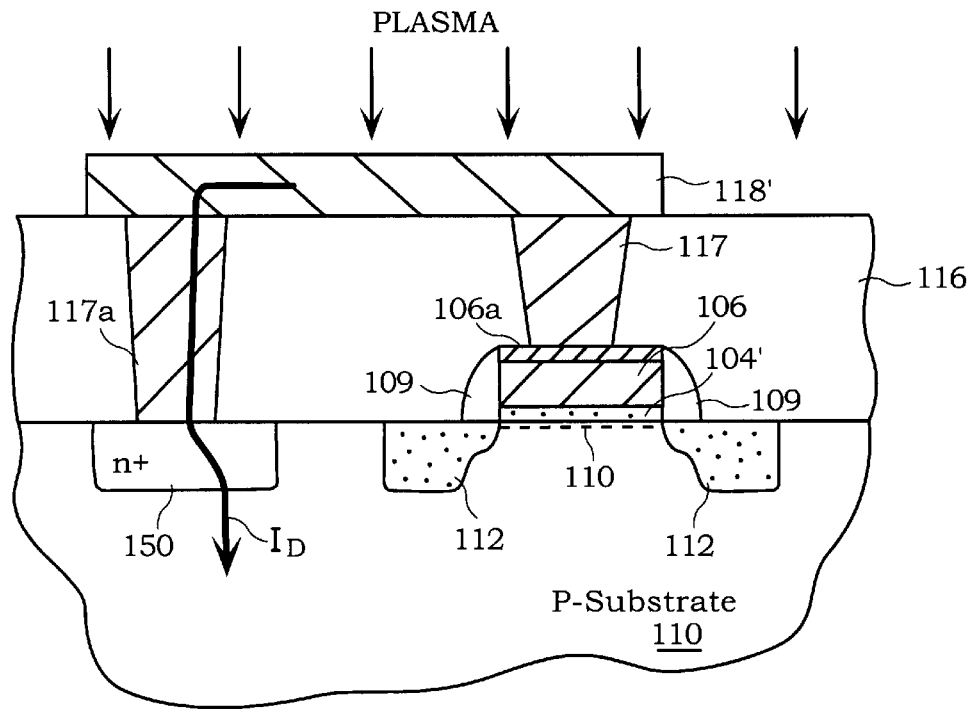
FIG. 1D shows a prior art design of a gate oxide protection device.
Figure 1E:
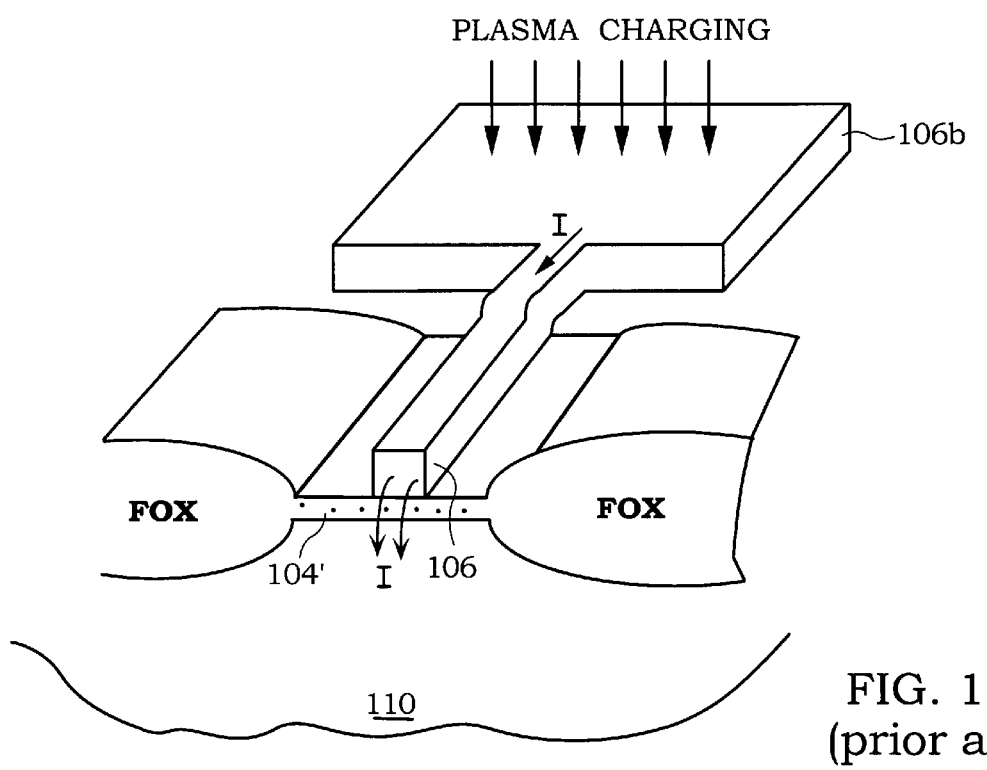
FIG. 1E shows a transistor gate structure having a large gate contact surface which behaves as an "antenna" to collect gate oxide destructive charging.
Figure 2:
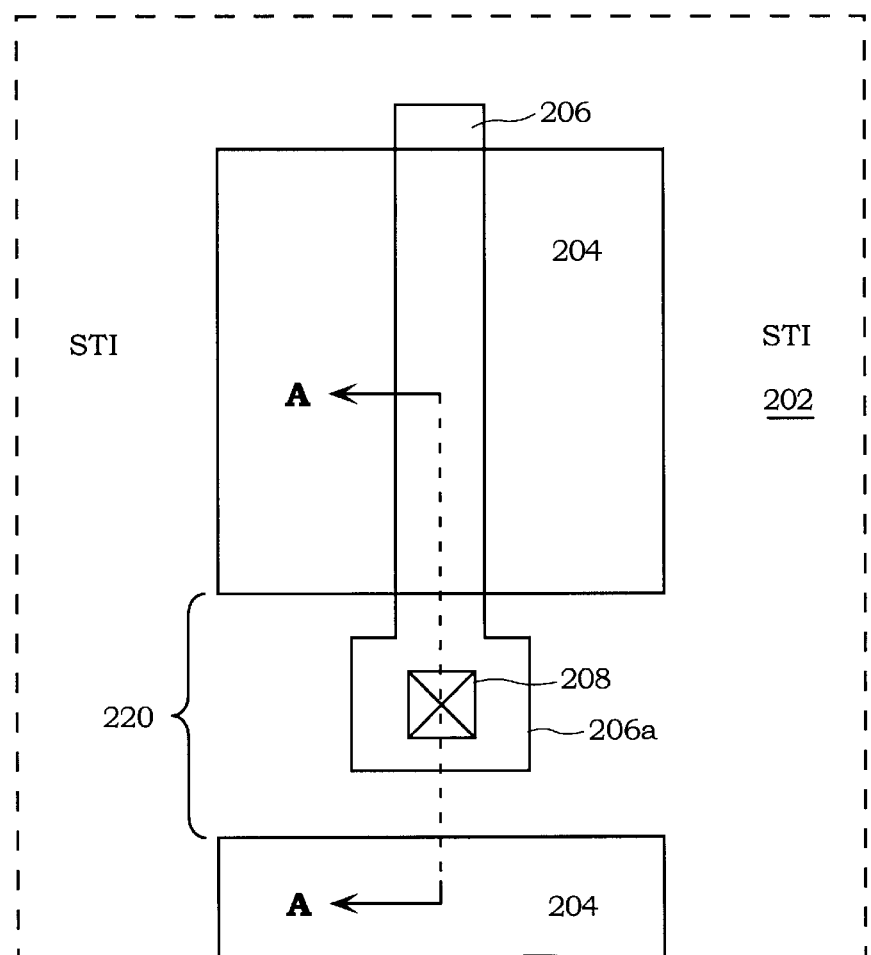
FIG. 2 shows a top representative view of shallow trench isolation (STI) regions which surround active regions in accordance with one embodiment of the present invention.

FIG. 2 shows a top representative view of shallow trench isolation (STI) regions 202 which surround active regions 204 in accordance with one embodiment of the present invention. In this embodiment, a representative transistor gate outline 206 is drawn over one of the active regions 204 and over part of shallow trench isolation region 202, which is commonly filled with deposited silicon dioxide ($SiO_2$). The transistor gate outline 206 typically includes a gate contact pad area 206a to facilitate electrical interconnection to subsequently formed interconnect structures.

In this embodiment, a gate oxide protection diode is fabricated into the shallow trench isolation region 202 under the gate contact pad 206a of the transistor gate outline 206. As will be described in greater detail below, the gate oxide protection diode is formed by etching a via hole into the shallow trench isolation oxide that will lie under the gate contact pad 206a. The via hole will then be filled with a doped polysilicon material that will make contact with the underlying substrate.

Thus, a contact outline 208 illustrates the preferred location of the doped polysilicon electrode, which will form part of the gate oxide protection diodes that will assist in protecting the gate oxide lying under a transistor gate that will be formed where the transistor gate outline 206 is shown. A more detailed description of the process operations implemented in making the gate oxide protection diodes follows, with reference to FIGS. 3A through 3J.

Figure 3A:
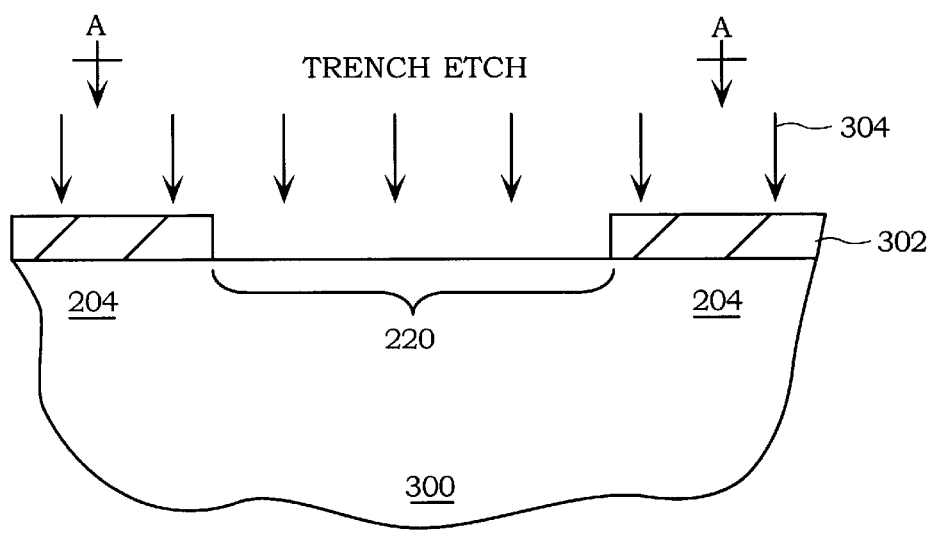
FIGS. 3A–3J illustrate the process operations performed in making a gate oxide protection diode device in a shallow trench isolation region in accordance with one embodiment of the present invention.

FIG. 3A shows a cross-sectional view of a semiconductor substrate 300 having a silicon nitride mask 302 that exposes portions of the semiconductor substrate 300 that will be etched to form shallow trench regions with a plasma etch 304 operation. The representative cross section A—A is shown across a separation 220, which will define a shallow trench isolation region between the exemplary active regions 204.

Figure 3B:
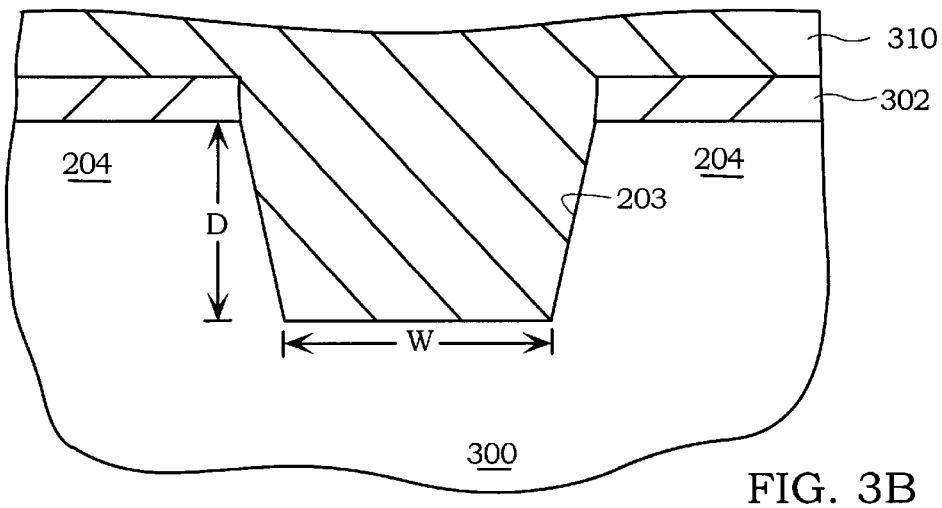

In this embodiment, the plasma etch 304 should be tailored to define a shallow trench 203, as shown in FIG. 3B, that is sufficiently deep to isolate the active regions 204. Preferably, the shallow trench 203 will have a depth "D" of between about 0.2 microns and about 0.4 microns, and most preferably about 0.3 microns. Also, the preferable width "W" of the shallow trench 203 that lies between the active regions 204 will be between about 0.2 microns and about 1 micron, and more preferably about 0.6 microns. Of course, the width dimensions do vary depending on the custom separations between active regions or dummy active regions.

Once the shallow trench 203 has been defined throughout a semiconductor device in order to isolate all of the active regions 204, a shallow trench isolation oxide 310 is deposited throughout a wafer in order to fill the shallow trench regions 203. Once the oxide material 310 has been deposited to adequately fill all of the shallow trench regions 203 throughout a wafer, a chemical mechanical polishing (CMP) operation is performed.

Figure 3C:
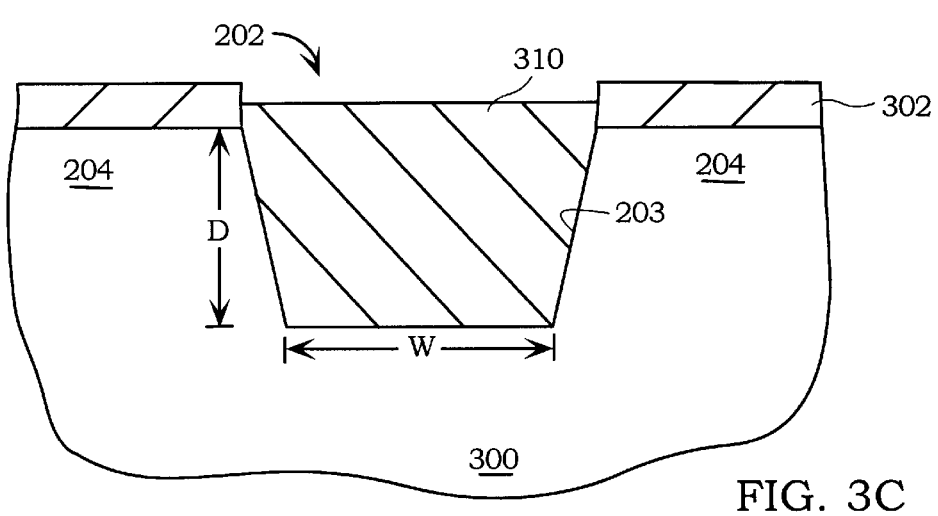
Figure 3D:
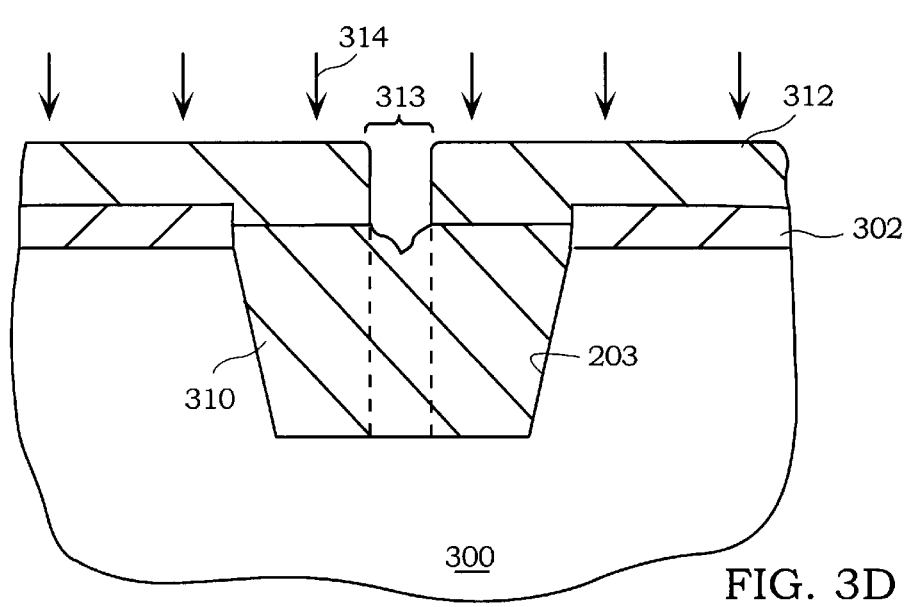

As shown in FIG. 3C, the chemical mechanical polishing operation is preferably well suited to substantially remove the shallow trench isolation oxide 310 from over the silicon nitride mask 302. In this embodiment, a silica slurry is preferably used during the chemical mechanical polishing in order to remove the shallow trench isolation oxide 310 from over the silicon nitride mask 302, such that the shallow trench isolation oxide 310 lies just below the top surface of the silicon nitride mask 302. In one embodiment, the silica slurry may be an ILD1300 type, which is available from Rodel Inc. of Newark, Del.

Next, a photoresist mask 312 is spin-coated over the silicon nitride mask 302 and the shallow trench isolation regions 202. The photoresist mask 312 is then patterned using conventional photolithography techniques in order to define a window 313 (and corresponding windows 313 throughout the integrated circuit design) in the photoresist mask 312. The window 313 will therefore enable a plasma etch 314 that defines a via hole into the shallow trench isolation oxide 310. In this example, the plasma etch 314 should proceed until the via hole is etched through the shallow trench isolation oxide 310 and a path down to the semiconductor substrate 300 is defined. Once the via hole is defined into the shallow trench isolation oxide 310 and a path down to the semiconductor substrate 300 has been defined in FIG. 3D, the photoresist mask 312 will then be stripped.

Figure 3E:
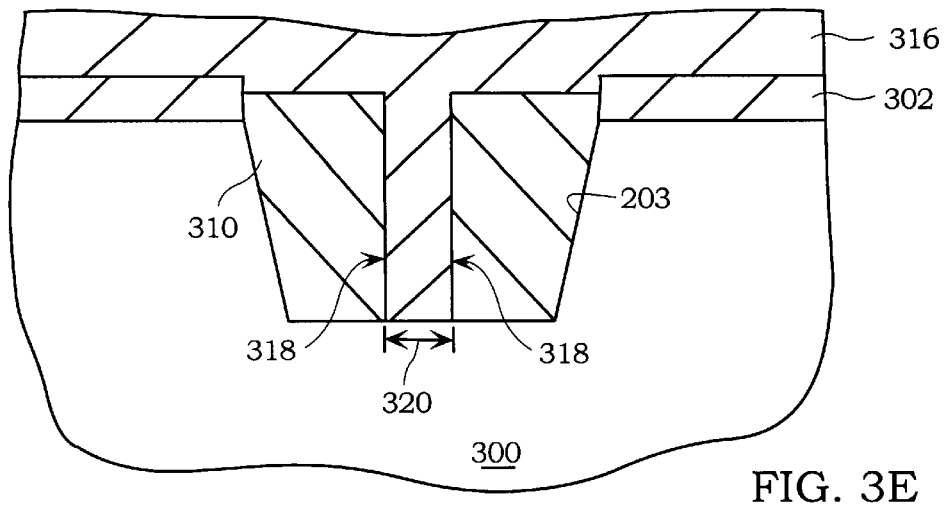

FIG. 3E shows the cross-sectional view of the semiconductor substrate 300 after a doped polysilicon layer 316 has been deposited over the semiconductor wafer. In this embodiment, the doped polysilicon layer 316 also contains nitrogen. Preferably, the nitrogen content is selected to be between about 0.1% by wt. and about 5% by wt., and most preferably about 1% by wt. As will be described below, the nitrogen content will preferably suppress the growth of a subsequently formed gate oxide layer.

The doped polysilicon layer 316 is preferably deposited to a thickness of between about 1,000 angstroms and about 2,000 angstroms, and most preferably, about 1,500 angstroms. But of course, the preferred thickness of the doped polysilicon 316 should be selected in order to fill the via hole that is defined into the shallow trench isolation oxide 310.

In this example, the via hole has walls 318 which extend all the way down to the semiconductor substrate material 300. Preferably, the doped polysilicon material 316, which is deposited into the via hole will have a diameter 320 that is between about 0.1 microns and about 0.5 microns, and most preferably, about 0.35 microns. In general, the via hole should have a diameter that is approximately the same as a subsequently formed gate contact.

In this preferred embodiment, the doped polysilicon layer 316 is an in situ doped polysilicon material, which has an N-type dopant concentration of between about $1\times10^{17}$ atoms/cm$^3$ and about $1\times10^{21}$ atoms/cm$^3$, and most preferably, about $1\times10^{20}$ atoms/cm$^3$. An exemplary N-type dopant may be a phosphorous impurity or any other suitable N-type dopant material. In an alternative embodiment, the doped polysilicon layer 316 can also be implanted with an N-type dopant and then subjected to a suitable heat anneal treatment. In addition, the doped polysilicon layer 316 can also be a P-type doped material when the substrate is an N-type substrate or the transistor is a P-channel transistor that is fabricated in an N-type well.

Once the doped polysilicon layer 316 has been adequately deposited to fill the via hole that is defined in the shallow trench isolation oxide 310, a chemical mechanical polishing operation is performed in order to remove the doped polysilicon layer 316 that lies over the silicon nitride mask 302 and substantially over the shallow trench isolation oxide 310. Once the chemical mechanical polishing operation has been performed, the silicon nitride material 302 is stripped using a suitable phosphoric acid ($H_3PO_4$) solution.

Figure 3F:
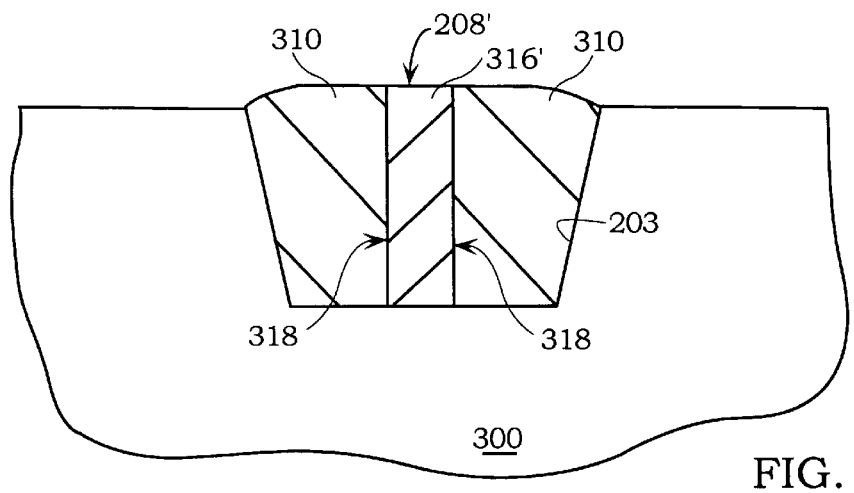

After the silicon nitride mask 302 has been stripped, the semiconductor substrate 300 as shown in FIG. 3F will have a doped polysilicon electrode 316' physically in contact with the semiconductor substrate 300. In a preferred embodiment, the doped polysilicon electrode 316' is N-doped, and the semiconductor substrate 300 is a P-type substrate. Accordingly, the interface between the doped polysilicon electrode 316' and the semiconductor substrate 300 will define a gate oxide protection diode, which will be described in greater detail below.

Figure 3G:
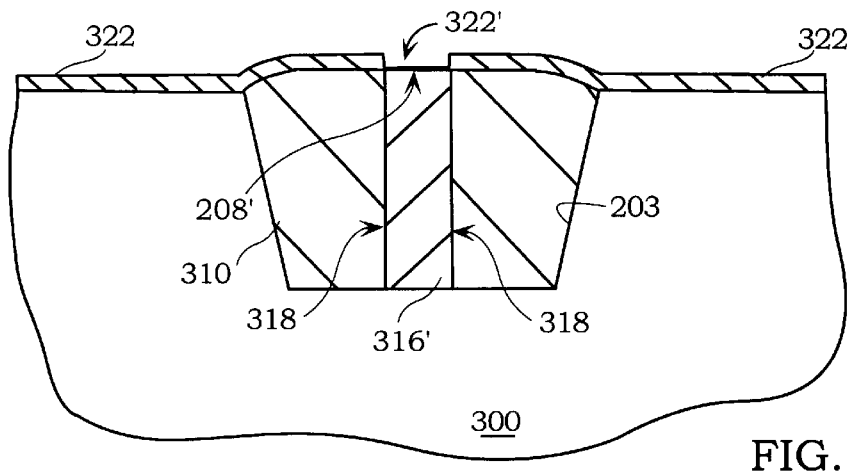

The top end area of the doped polysilicon electrode 316' will therefore have a top surface 208' which will define the interface between a subsequently deposited gate electrode and the solid state protection diode structure. At this point, the surface of the semiconductor wafer is cleaned and a gate oxide 322 is grown over the surface as shown in FIG. 3G. Preferably, the oxide is grown to a thickness of between about 40 angstroms and about 60 angstroms, and most preferably to a thickness of about 55 angstroms. Because the doped polysilicon electrode 316' contains nitrogen, the growth rate over the gate oxide layer 322 will be much slower over the surface 208' than over the substrate 300 or the shallow trench isolation oxide 310. Thus, a thin oxide region 322' will develop over the surface 208' of the doped polysilicon electrode 316'. In one embodiment, the thin oxide region 322' is between about 12 angstroms and about 40 angstroms, and more preferably between about 15 angstroms and about 30 angstroms, and most preferably about 25 angstroms.

Figure 3H:
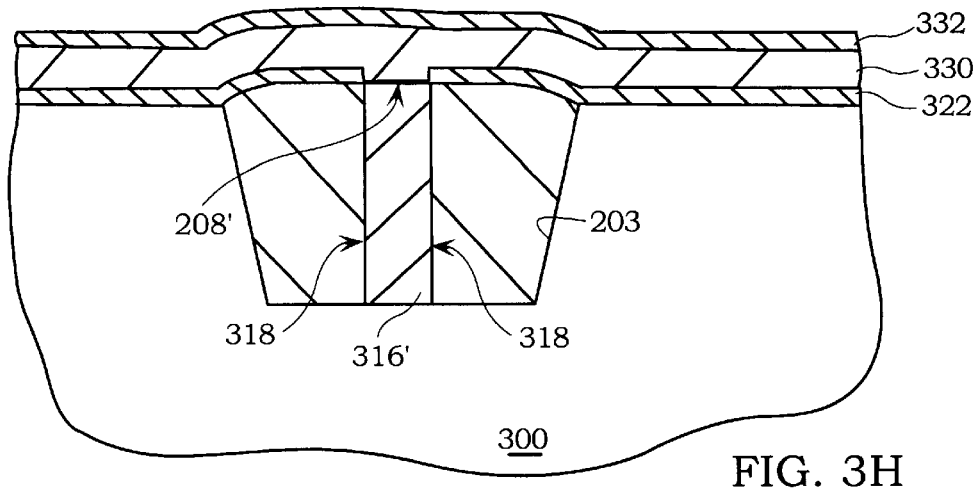
Figure 3I:
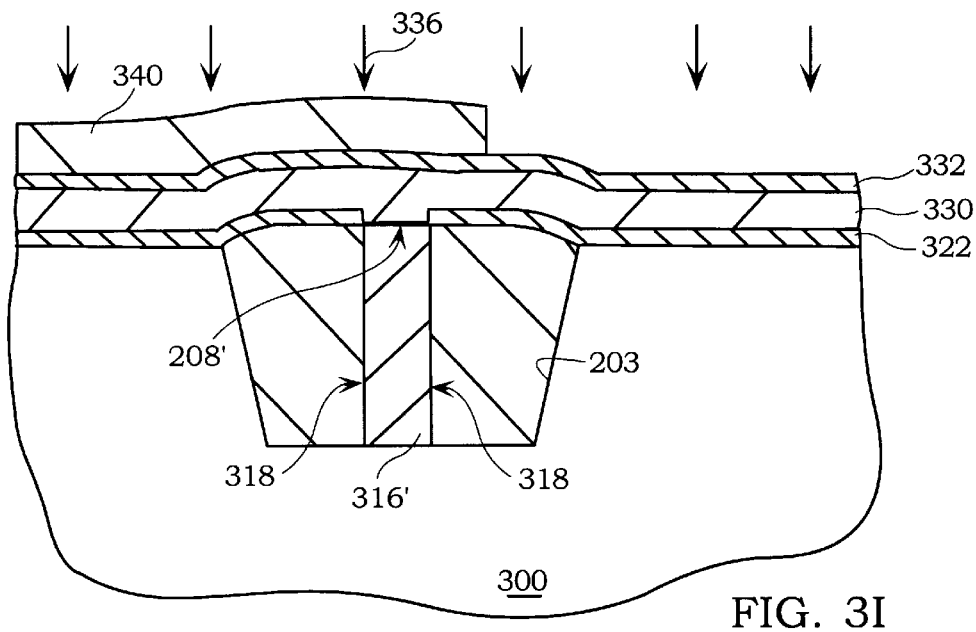

FIG. 3H shows the cross-sectional view of FIG. 3G after a polysilicon gate layer 330 has been deposited and a titanium silicide ($TiSi_2$) layer 332 has been formed over the polysilicon gate layer 330. Preferably, the polysilicon gate 330 and the titanium silicide layer 332 will be formed to a thickness of about 2,500 angstroms. Once the polysilicon gate layer 330 and the titanium silicide layer 332 have been formed over the gate oxide 322, a photoresist mask 340, as shown in FIG. 3I, will be patterned over the titanium silicide layer 332.

At this point, a plasma etch 336 is performed to etch the desired outline of the polysilicon gates of the transistors that are formed throughout the semiconductor wafer. As discussed above, the plasma etch 336 performed in conventional processes cause substantial damage to the gate oxide 322 due to the formation of traps that degrade the gate oxide layer 322. Advantageously, the doped polysilicon electrode 316' will be in substantial contact with the polysilicon gate material 330 (through the thin gate oxide 322') during plasma etch operations, which will define the aforementioned diode structure that sinks plasma induced currents (or electron flows) to or from the substrate 300.

Figure 3J:
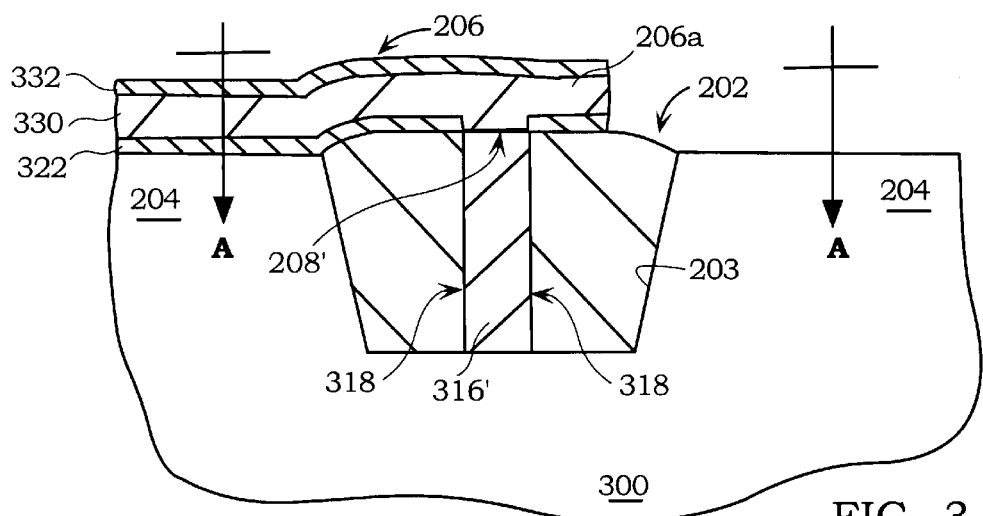

As shown in FIG. 3J, the resulting transistor gate structure that includes a gate oxide 322, a polysilicon gate layer 330, and a titanium silicide layer 332, will at least partially overlie the doped polysilicon electrode 316' that is formed in the shallow trench isolation regions 202. The cross-section A—A, which is shown in FIG. 2 above, is provided in FIG. 3J to illustrate the electrical interconnection between the resulting polysilicon gate and the substrate 300 (i.e., through the doped polysilicon electrode 316'). More specifically, the gate contact pad 206a will lie substantially over the doped polysilicon electrode 316' so that subsequent plasma etch operation of interconnecting structures will also be in electrical contact with the gate oxide protection diode structure.

Figure 4A:
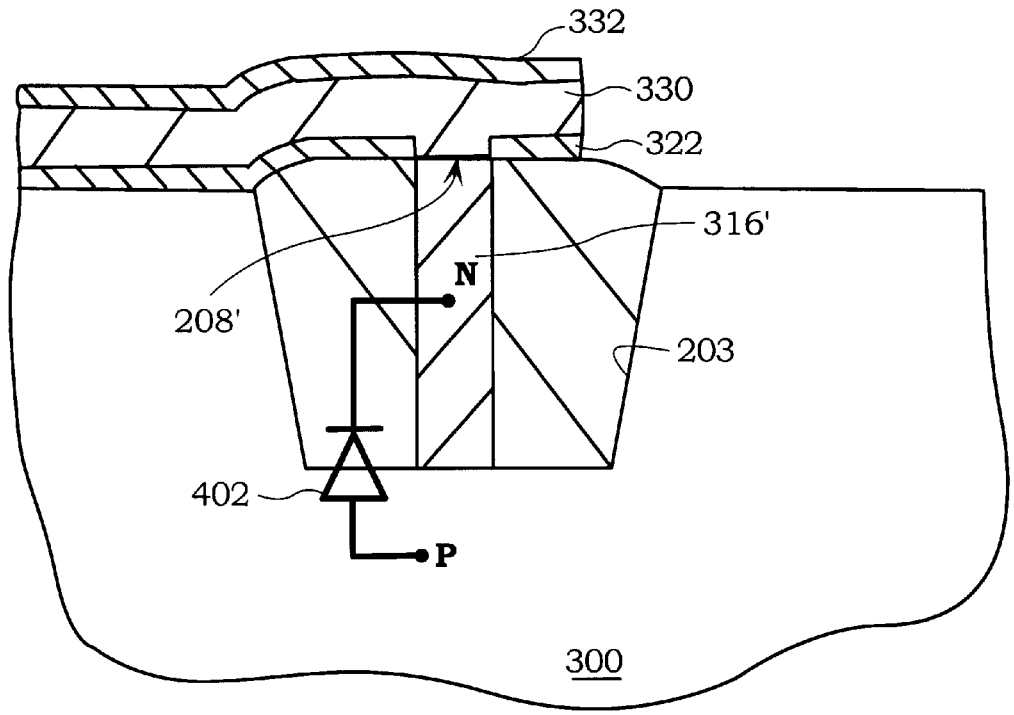
FIG. 4A shows a more detailed diagram of a solid state diode structure that is created due to the physical interface between an N-doped polysilicon electrode and a P-type substrate in accordance with one embodiment of the present invention.

FIG. 4A shows a more detailed diagram of a solid state diode structure 402 that is formed due to the physical interface between the doped polysilicon electrode 316' and the P-type substrate 300. As will be described in greater detail below, the solid state diode structure 402 will actually be a leaky diode structure which will allow plasma induced currents to flow from the polysilicon gate structure down to the substrate. When these plasma induced currents flow in this direction, the solid state diode structure will actually be operating as a reversed bias diode.

Figure 4B:
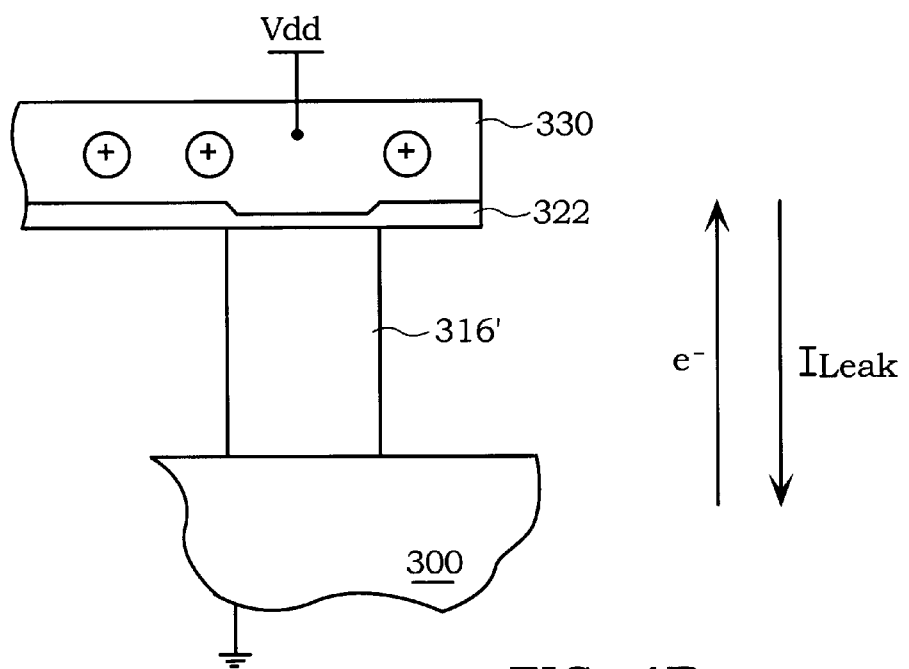
FIGS. 4B–4D illustrate representative leakage current flows and electron flows when plasma induced charging occurs, and during normal transistor operation in accordance with one embodiment of the present invention.

As shown in FIG. 4B, when the polysilicon gate structure 330 becomes positively charged during a plasma etch operation, or receives a positive rail voltage Vdd, a slight amount of current "$I_{Leak}$" will flow between the polysilicon gate 330, through the doped polysilicon electrode 316', and through the semiconductor substrate 300, which may be coupled to ground. Of course, the flow of electrons "$e^-$" will be in the opposite direction of current, and therefore the flow will be from the semiconductor substrate 300 to the polysilicon gate 330.

However, during normal transistor operation, the applied gate voltage Vdd will be well suited to appropriately turn ON the transistor even though a small flow of leakage current may occur through the diode structure. By way of example, the flow of current through a protection diode structure during normal operation will typically be less than about 100 pico Amps per gate. Accordingly, the diode structure will allow enough leakage current to flow when plasma etching induced currents are produced, and at the same time prevents the current flow from being too large to affect normal transistor operation. It should still be appreciated that even though a small amount of leakage current may flow through the diode structure during normal operation, the transistor structure will be more robust because the sensitive gate oxide was adequately protected at each plasma etching stage.

Figure 4C:
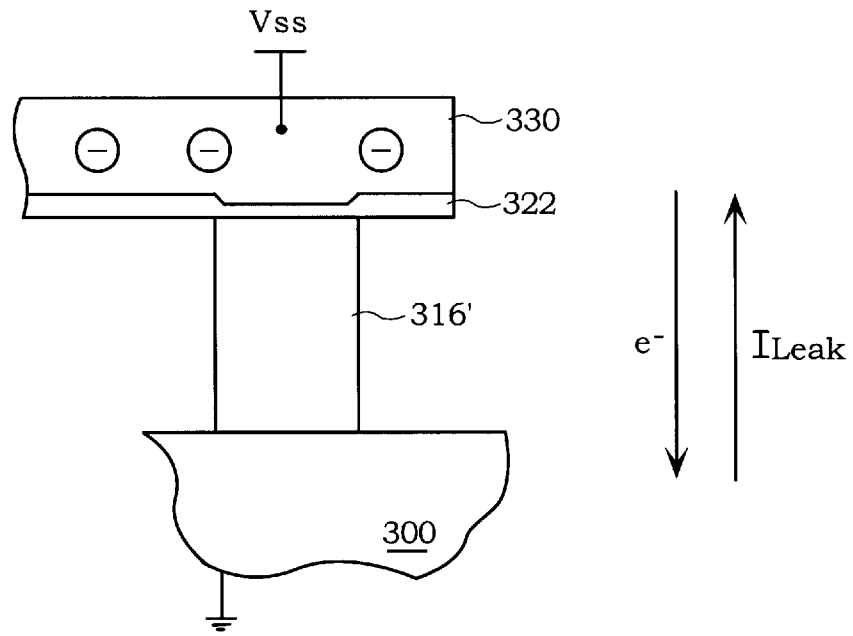
Figure 4D:
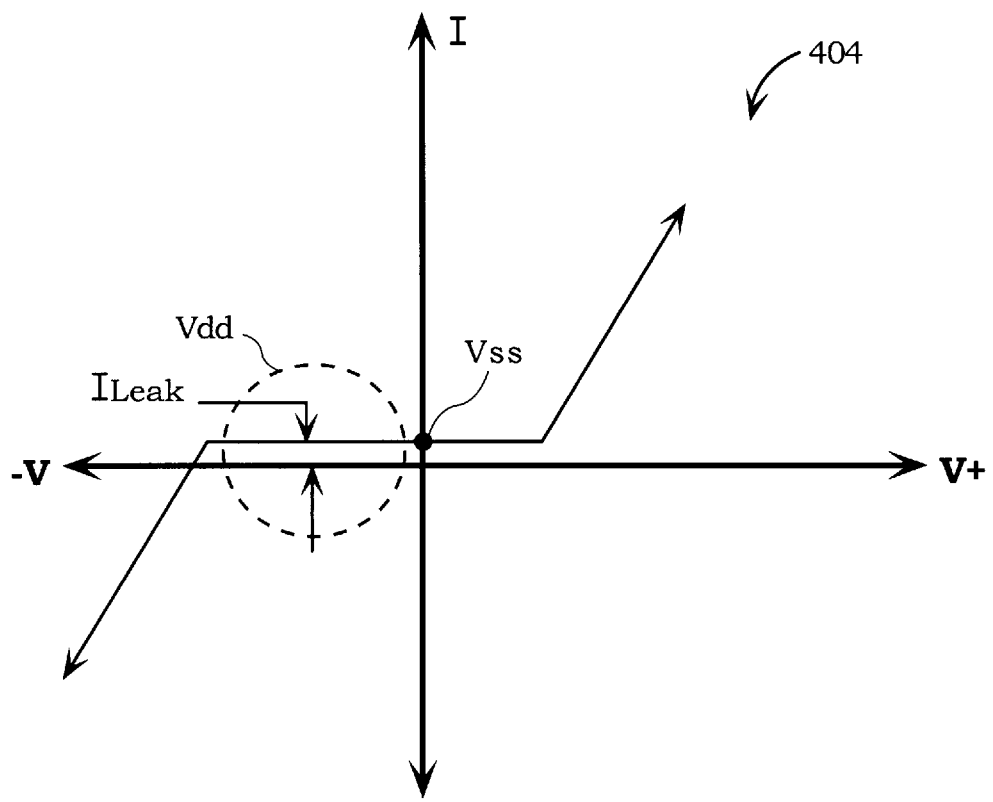

For ease of description, reference is drawn to FIG. 4D that shows a graph 404 that plots current vs. voltage of the solid state diode structure in accordance with one embodiment of the present invention. As shown, when an N-channel transistor is in normal operation and a Vdd voltage is applied to the transistor gate, no more than the $I_{Leak}$ current will flow through the diode structure, which will be operating in a reverse biased manner.

FIG. 4C shows an example of a case where the polysilicon gate structure 330 becomes negatively charged during a plasma etch operation, or when a ground rail voltage Vss is applied during normal operation. When the gate becomes negatively charged during a plasma operation, the protection diode structure may enable a current having a magnitude equal to $I_{Leak}$ to flow from the semiconductor substrate 300 and to the polysilicon gate structure 330. At the same time, the negative charge that is built up on the polysilicon gate structure 330 will be discharged by a flow of electrons "$e^-$" from the polysilicon gate structure 330 to the semiconductor substrate 300 that is coupled to ground. Of course, if the polysilicon gate structure 330 is coupled to a ground rail Vss, a leakage current equal to $I_{Leak}$ will also possibly flow between the polysilicon gate structure 330 and the semiconductor substrate 300 as shown in FIG. 4D. Although this amount of leakage current is probable, it is not believed to be large enough to affect normal transistor operation.

Figure 5:
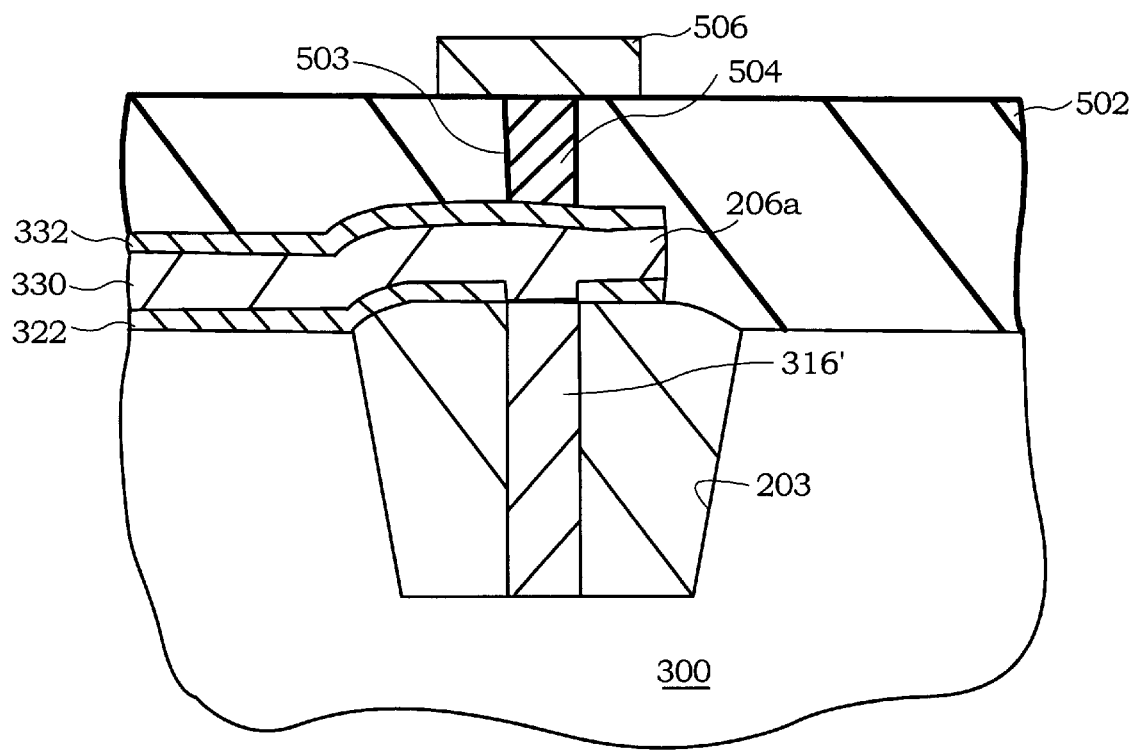
FIG. 5 shows a cross-sectional view of the semiconductor substrate after additional semiconductor fabrication has been performed over the solid state diode in accordance with one embodiment of the present invention.

FIG. 5 shows a cross-sectional view of the semiconductor substrate 300 after additional semiconductor fabrication has been performed in accordance with one embodiment of the present invention. As shown, an intermetal oxide layer 502 is deposited over the polysilicon gate structure 330 having the titanium silicide layer 332. Once the intermetal oxide layer 502 is deposited and a chemical mechanical polishing operation is performed to planarize the top surface of the oxide layer 502, a via hole 502 is etched into the intermetal oxide layer 502 in order to define a path down to the polysilicon gate (e.g., typically over the gate contact pad 206a which is shown in FIG. 2 above).

During the via hole etch operation, the aforementioned negatively charged electrons and positively charged ions of the plasma etch will come into electrical contact with the polysilicon gate. However, because the polysilicon gate is now in contact with the doped polysilicon electrode 316' which forms a diode structure with the semiconductor substrate 300, the gate oxide 322 will be adequately protected from the formation of oxide degrading traps.

Accordingly, the gate oxide 322 is not only protected from the plasma etch operation that is used to pattern the polysilicon gate, but also protects the gate oxide 322 from the plasma etch used to make the via hole 503 through the intermetal oxide layer 502. In a further operation, a metallization layer is deposited over the intermetal oxide layer 502 and then patterned using a plasma etching operation to form a patterned metallization line 506. Again, the plasma etching used to pattern the metallization line 506 is in electrical contact with the polysilicon gate structure through a conductive via 504, which may be a tungsten plug.

As a result, the damaging currents produced by the electrons and positively charged ions produced during any of the plasma etch operations will advantageously flow away from the sensitive gate oxide 322. It will also be apparent to those skilled in the art that as many of the subsequent interconnecting metal layers are deposited and plasma etched (e.g., in some designs the number of metallization layers can be up to 5 or more layers), the gate oxide 322 will continue to be protected by the protection diode structure. As a result, the transistor structures that rely on the insulating properties of the gate oxide 322 will not become leaky and thus fail to operate in their intended manner. For example, as mentioned above with respect to the prior art, when a gate oxide becomes degraded, the transistor device may turn ON (i.e., become leaky) even when it is intended to be in an OFF state, which may therefore produce a malfunction in an integrated circuit device.

Figure 6:
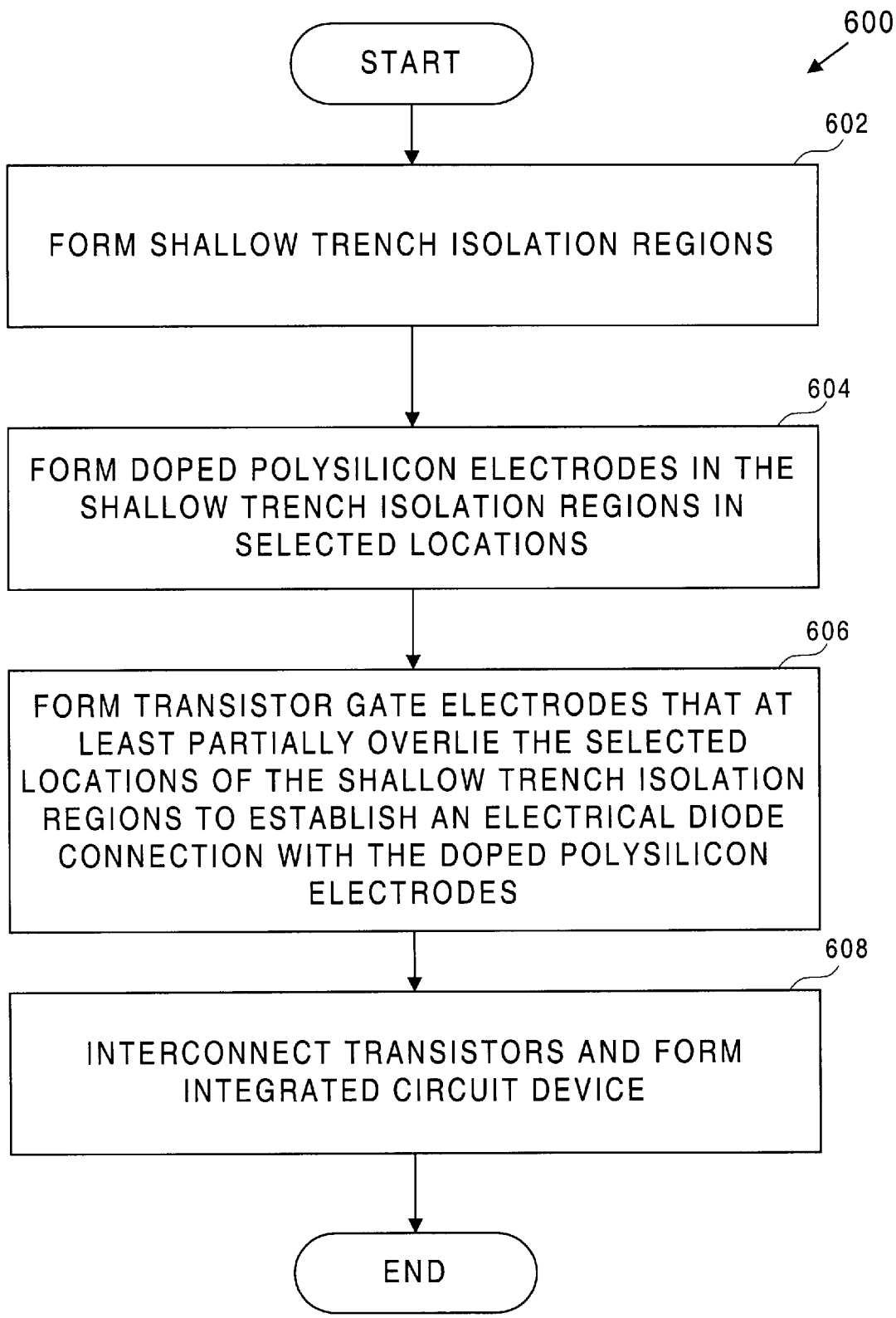
FIG. 6 is a flowchart diagram illustrating the preferred method operations that may be implemented to fabricate an integrated circuit device having at least one protection diode in accordance with one embodiment of the present invention.

FIG. 6 is a flowchart diagram 600 illustrating the preferred method operations that may be implemented to fabricate an integrated circuit device having at least one protection diode in accordance with one embodiment of the present invention. Although the foregoing description has been directed toward an individual protection diode, in practice, a multitude of protection diodes are simultaneously fabricated throughout an integrated circuit device to protect all (or most) of the sensitive transistor gate oxide layers.

With this in mind, the method begins at an operation 602 where shallow trench isolation regions are formed throughout an integrated circuit device. As mentioned above, the shallow trench isolation regions are typically fabricated by etching trenches around active regions (and sometimes dummy active regions) throughout an integrated circuit design, and then subsequently filling the trenches with an insulating oxide material. Once the shallow trench isolation (STI) regions have been formed in operation 602, the method will proceed to an operation 604. In operation 604, doped polysilicon electrodes are formed in the shallow trench isolation regions in selected locations.

Preferably, the selected locations are those that lie where subsequently formed gate electrodes will reside. For example, as shown in FIG. 2 above, the doped polysilicon electrodes will preferably reside below the gate contact pad 206a of the subsequently formed polysilicon gate electrode. Once the doped polysilicon electrodes have been formed in the shallow trench isolation regions, the method will proceed to an operation 606. In operation 606, transistor gate electrodes are formed throughout the integrated circuit device.

As shown in FIG. 2 above, the transistor gate electrodes are preferably at least partially lying over the selected locations of the shallow trench isolation regions that contain the doped polysilicon electrodes. In this manner, an electrical diode connection can be established between the transistor gate electrodes and the doped polysilicon electrodes that are in contact with the substrate. Once the transistor gate electrodes have been formed in operation 606, the method proceeds to an operation 608 where the transistors are interconnected to form the desired circuits for the particular integrated circuit device.

As mentioned above, the solid state diode that is formed by the doped polysilicon electrode that is in contact with the substrate will protect the gate oxides throughout the remaining process operations which may involve multiple stages of plasma etching that are implemented to form the interconnect structures. Once the transistors are interconnected and the proper integrated circuit device has been formed, the method will end.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor structure for suppressing gate oxide plasma charging damage, comprising:

a shallow trench isolation region configured to isolate an active region of a semiconductor substrate;

a doped polysilicon electrode having a first end and a second end, the doped polysilicon electrode being defined in the shallow trench isolation region and the first end being in electrical contact with the semiconductor substrate; and a polysilicon gate that has an underlying gate oxide is defined over the active region and extends over part of the shallow trench isolation region to make electrical interconnection between the polysilicon gate and the second end of the doped polysilicon electrode.

2. A semiconductor structure for suppressing gate oxide plasma charging damage as recited in claim 1, wherein a portion of underlying gate oxide that is between the polysilicon gate and the second end of the doped polysilicon electrode is thinner than other portions of the underlying gate oxide.

3. A semiconductor structure for suppressing gate oxide plasma charging damage as recited in claim 1, wherein the doped polysilicon electrode has a dopant concentration of between about $1\times10^{17}$ atoms/cm$^3$ and about $1\times10^{21}$ atoms/cm$^3$.

4. A semiconductor structure for suppressing gate oxide plasma charging damage as recited in claim 3, wherein the doped polysilicon electrode contains a percentage of nitrogen ranging between about 0.1% by wt. nitrogen and about 5% by wt. nitrogen.

5. A semiconductor structure for suppressing gate oxide plasma charging damage as recited in claim 3, wherein the dopant is phosphorous.

6. A semiconductor structure for suppressing gate oxide plasma charging damage as recited in claim 2, wherein the portion of underlying gate oxide that is between the polysilicon gate and the second end of the doped polysilicon electrode has a thickness of between about 15 angstroms and about 30 angstroms.

7. A semiconductor structure for suppressing gate oxide plasma charging damage as recited in claim 3, wherein the doped polysilicon electrode is contained in a via hole that is defined in the shallow trench isolation region.

8. A semiconductor structure for suppressing gate oxide plasma charging damage as recited in claim 7, wherein the shallow trench isolation region is an oxide filled trench.

9. A semiconductor structure for suppressing gate oxide plasma charging damage as recited in claim 7, wherein an interface at the first end of the doped polysilicon electrode and the semiconductor substrate defines a solid state diode structure.

10. A semiconductor structure for suppressing gate oxide plasma charging damage as recited in claim 9, wherein the doped polysilicon electrode is in situ doped and the semiconductor substrate is one of a P-type substrate and an N-type substrate.

11. A diode structure for suppressing plasma charging damage to transistor gate oxides, the diode structure being defined in a shallow trench isolation region that is configured to isolate an active region of a semiconductor substrate, the diode structure comprises:

a doped polysilicon electrode means having a first end and a second end, the doped polysilicon electrode being defined in the shallow trench isolation region and the first end being in electrical contact with the semiconductor substrate; and a transistor gate means that has an underlying gate oxide is defined over the active region and extends over part of the shallow trench isolation region to make electrical interconnection between the transistor gate means and the second end of the doped polysilicon electrode means.

12. A diode structure for suppressing plasma charging damage to transistor gate oxides as recited in claim 11, wherein a portion of underlying gate oxide that is between the transistor gate means and the second end of the doped polysilicon electrode means is thinner than other portions of the underlying gate oxide.

13. A diode structure for suppressing plasma charging damage to transistor gate oxides as recited in claim 11, wherein the doped polysilicon electrode means has a dopant concentration of between about $1\times10^{17}$ atoms/cm$^3$ and about $1\times10^{21}$ atoms/cm$^3$.

14. A diode structure for suppressing plasma charging damage to transistor gate oxides as recited in claim 13, wherein the doped polysilicon electrode means contains a percentage of nitrogen ranging between about 0.1% by wt. nitrogen and about 5% by wt. nitrogen.

15. A diode structure for suppressing plasma charging damage to transistor gate oxides as recited in claim 13, wherein the dopant is phosphorous.

16. A diode structure for suppressing plasma charging damage to transistor gate oxides as recited in claim 12, wherein the portion of underlying gate oxide that is between the transistor gate means and the second end of the doped polysilicon electrode means has a thickness of between about 15 angstroms and about 30 angstroms.

17. A diode structure for suppressing plasma charging damage to transistor gate oxides as recited in claim 13, wherein the doped polysilicon electrode means is contained in a via hole that is defined in the shallow trench isolation region.

* * * * *